United States Patent
Shimazaki et al.

[11] Patent Number: 5,916,476
[45] Date of Patent: Jun. 29, 1999

[54] OXIDE MAGNETIC MATERIALS, MAKING METHOD, ANTENNA COILS, AND INDUCTANCE ELEMENTS

[75] Inventors: Tatsuya Shimazaki; Yutaka Saito, both of Akita, Japan

[73] Assignee: TDK Corporation, Tokyo, Japan

[21] Appl. No.: 09/047,999

[22] Filed: Mar. 26, 1998

[30] Foreign Application Priority Data

Apr. 1, 1997 [JP] Japan .................................. 9-081765

[51] Int. Cl.⁶ .................................................. C04B 35/28
[52] U.S. Cl. .................. 252/62.6; 252/62.62; 252/62.63; 252/62.59; 343/787; 343/788; 336/177; 336/233
[58] Field of Search ................................ 252/62.6, 62.63, 252/62.62, 62.59; 343/787, 788; 336/177, 233

[56] References Cited

FOREIGN PATENT DOCUMENTS

| 63-169005 | 7/1988 | Japan . |
| 8-91919 | 4/1996 | Japan . |
| 8-339913 | 12/1996 | Japan . |

*Primary Examiner*—Melissa Koslow
*Attorney, Agent, or Firm*—Oblon, Spivak, McClelland, Maier & Neustadt, P.C.

[57] ABSTRACT

To an oxide magnetic material consisting essentially of, calculated as oxides, 15–30 mol % of $Fe_2O_3$, 6–12 mol % of CuO, and 58–79 mol % of NiO as main ingredients, 1.5–4.5% by weight of PbO, 1.0–3.7% by weight of $SiO_2$, 0.7–1.0% by weight of CoO, and 0.01–1.0% by weight of ZnO are added as additives. The material is suited to form magnetic cores for operation in high-frequency bands.

5 Claims, 4 Drawing Sheets

OXIDE MAGNETIC MATERIALS, MAKING METHOD, ANTENNA COILS, AND INDUCTANCE ELEMENTS

BACKGROUND OF THE INVENTION

1. Field of the Invention

This invention relates to oxide magnetic materials, making method, antenna coils, and inductance elements for preparing the same.

2. Prior Art

Oxide magnetic materials are often used to form magnetic cores which find use in antenna coils and inductance elements built in pagers (or beepers) and other electronic equipment adapted to operate in high-frequency bands of 200 to 500 MHz.

As disclosed in JP-A 169005/1988, such oxide magnetic materials are used as magnetic cores in inductance elements such as band filters in electronic equipment adapted to operate in high-frequency bands of about 200 MHz or higher.

Loop antennas with air-core coils are often used in pagers. The loop antennas have the advantage of high Q, but are difficult to adjust inductance and other properties which are, in turn, susceptible to fluctuation by external forces such as vibration. To increase the inductance, the number of turns of winding must be increased, resulting in a larger size of coil as a whole.

In contrast, coils with cores made of an oxide magnetic material as disclosed in the above-referred JP-A 169005/1988 have the advantages of easy adjustment of inductance and size reduction, but the disadvantage of low Q.

An improvement in Q of oxide magnetic material is disclosed in JP-A 339913/1996. This oxide magnetic material is successful in achieving high Q, but has an undesirably high temperature coefficient of inductance. Typical examples are oxide magnetic materials consisting essentially of 23 mol % of $Fe_2O_3$, 9 mol % of CuO and 68 mol % of NiO as main ingredients and containing PbO, $SiO_2$ and CoO as additives. Table 1 shows the initial permeability ($\mu i$), the Q value at 280 MHz and the temperature coefficient of inductance ($\alpha \mu r$) at 100 kHz of these materials.

TABLE 1

| PbO (wt %) | $SiO_2$ (wt %) | CoO (wt %) | $\mu i$ | Q | $\alpha \mu r$ (ppm/° C.) |
|---|---|---|---|---|---|
| 3.0 | 1.7 | 2.0 | 3 | 300 | 380 |
| 3.0 | 0.7 | 1.0 | 3 | 250 | 327 |

As seen from Table 1, these materials are improved in Q, but have a high temperature coefficient of inductance which is undesirable for use as high-frequency inductors such as antenna coils.

As described above, loop antennas are conventionally used in pagers and other electronic equipment. Despite the advantage of high Q, the loop antennas are generally of large size as a whole. Coils using magnetic cores of the oxide magnetic material of JP-A 339913/1996 can be reduced in size because of high inductance and have high Q, but suffer from a high temperature coefficient of inductance. Since a high temperature coefficient of inductance means that inductance largely varies with temperature changes, antenna coils made of such oxide magnetic material become unstable in tuning frequency and sensitivity.

SUMMARY OF THE INVENTION

An object of the present invention is to provide an oxide magnetic material wherein the identity and amount of additives are selected so that magnetic cores formed therefrom may have a low temperature coefficient of inductance while maintaining high Q.

In a first aspect, the invention provides an oxide magnetic material consisting essentially of 15 to 30 mol % of $Fe_2O_3$, 6 to 12 mol % of Cuo, and 58 to 79 mol % of Nio as main ingredients, and further containing 1.5 to 4.5% by weight of PbO, 1.0 to 3.7% by weight of $SiO_2$, 0.7 to 1.0% by weight of CoO, and 0.01 to 1.0% by weight of ZnO as additives, provided that all ingredients are calculated as oxides. The oxide magnetic material is suitable for operation in a high-frequency band, typically of 200 to 500 MHz.

In a second aspect, the present invention provides a method for preparing an oxide magnetic material for use in high-frequency bands, comprising the steps of mixing a $Fe_2O_3$ source, a CuO source, and a NiO source as main ingredients, and a PbO source, talc, a CoO source, and a ZnO source as additives, and firing the resulting mixture. The amounts of the sources are selected such that the resulting oxide magnetic material may have the above-defined composition. When oxides $Fe_2O_3$, CuO, NiO, PbO, talc, CoO, and ZnO are used as the sources, the amounts of these oxides added are the same as in the fired oxide magnetic material except that talc is added in an amount of 1.5 to 5.5% by weight.

Also contemplated herein is an antenna coil or inductance element comprising a magnetic core of the oxide magnetic material defined above.

DETAILED DESCRIPTION OF THE INVENTION

Figure 1:
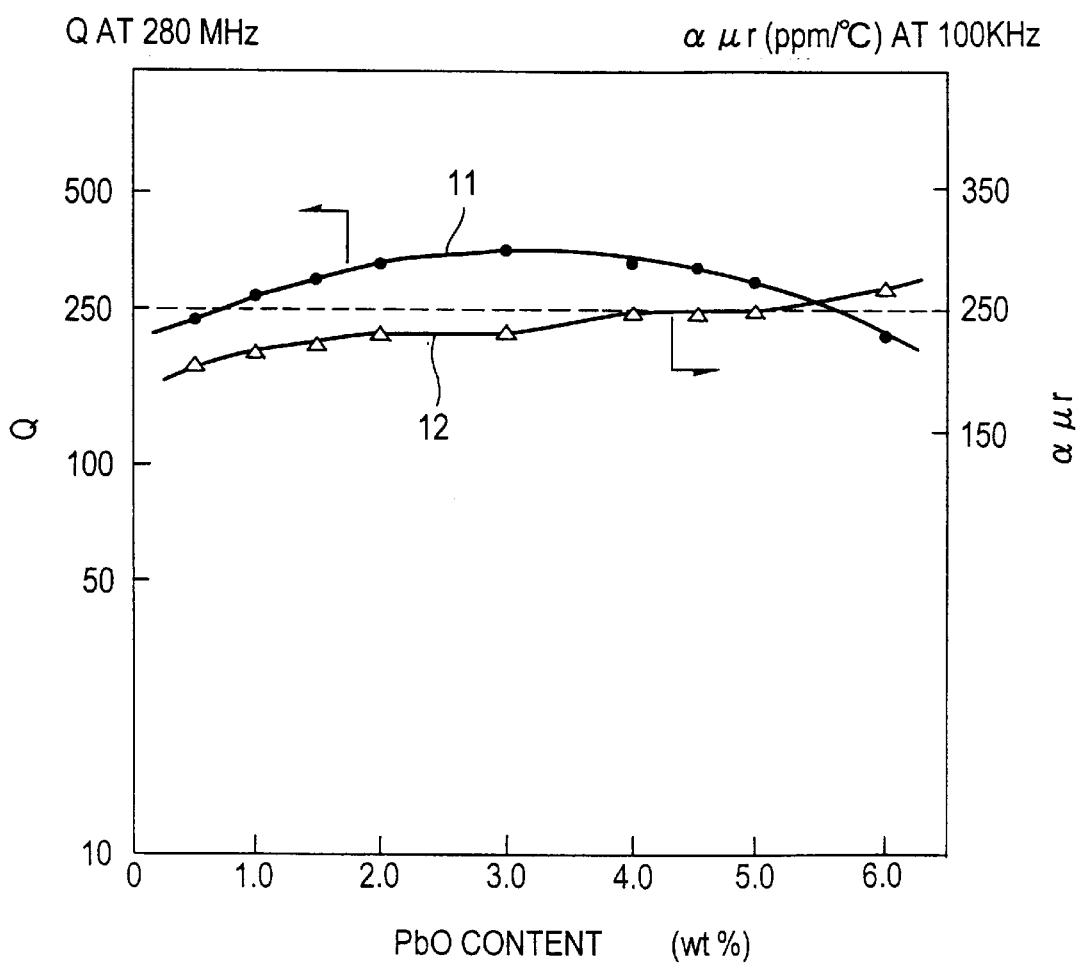
FIG. 1 is a graph showing the Q and temperature coefficient of inductance of oxide magnetic materials as a function of a PbO content.

According to the invention, PbO, $SiO_2$, CoO, and ZnO are added as additives to an oxide magnetic material consisting essentially of $Fe_2O_3$, CuO, and NiO as main ingredients. More specifically, the oxide magnetic material of the invention consists essentially of 15 to 30 mol % of $Fe_2O_3$, 6 to 12 mol % of CuO, and 58 to 79 mol % of NiO as main ingredients, and contains 1.5 to 4.5% by weight of PbO, 1.0 to 3.7% by weight of $SiO_2$, 0.7 to 1.0% by weight of CoO, and 0.01 to 1.0% by weight of ZnO as additives, provided that all ingredients are calculated as stoichiometric oxides. Preferably, the oxide magnetic material contains 1.5 to 3.0% by weight of PbO, 2.5 to 3.5% by weight of $SiO_2$, 0.7 to 0.9% by weight of CoO, and 0.3 to 0.9% by weight, especially 0.5 to 0.9% by weight, of ZnO as additives. The additives PbO, $SiO_2$, CoO, and ZnO are present at grain boundaries.

The oxide magnetic material of the invention is prepared by mixing a $Fe_2O_3$ source, a CuO source, and a NiO source as main ingredients, adding thereto a PbO source, talc, a CoO source, and a ZnO source as additives, and firing the resulting mixture. Typically, oxides $Fe_2O_3$, CuO, NiO, PbO, CoO, and ZnO are used as the starting materials while talc is used as the $SiO_2$ source because it is inexpensive. When these oxides are used as the sources, the amounts of the oxides added are the same as in the fired oxide magnetic material except that talc is added in an amount of 1.5 to 5.5% by weight. Since talc has the composition: $Mg_3(Si_4O_{10})(OH)_2$, a minor amount of MgO is left after firing. The fired oxide magnetic material having MgO left therein is equivalent to MgO-free oxide magnetic materials and exhibits little difference in properties. The oxide magnetic material of the invention is effective for improving the temperature coefficient of inductance while maintaining high Q in a frequency band of 200 to 500 MHz.

The preparation method may be carried out as conventional. The sources are generally in powder form having a mean particle size of less than about 10 $\mu$m. The firing step is effected at a temperature of 800 to 1,000° C. for about ½ to 5 hours.

Antenna coils and inductance elements using magnetic cores of the oxide magnetic material defined above have an improved temperature coefficient of inductance and high Q in a high-frequency band, typically of 200 to 500 MHz.

EXAMPLE

Examples of the invention are given below by way of illustration and not by way of limitation.

Example 1

Sample Nos. 1 and 2 were prepared in accordance with a conventional procedure by mixing source materials such that the composition shown below might be finally obtained, calcining the mixture, pulverizing the mixture, pressure molding the powder into the desired shape (rod or toroidal shape suitable for cores), and firing the compacts at a temperature of 800 to 1,000° C. for about 2 hours.

The final composition had a basic composition consisting of 23 mol % of $Fe_2O_3$, 9 mol % of Cuo, and 68 mol % of NiO, to which 3.0% by weight of PbO, 1.7% by weight of $SiO_2$, and 1.0% by weight of CoO were added as additives. In addition, sample Nos. 1 and 2 further contained 0.3% and 0.7% by weight of ZnO, respectively. In the mixing step, the oxides were used as the sources in the same amounts as in the final composition.

The rod-shaped cores were 21 mm long, 9 mm wide, and 5.5 mm thick. The toroidal cores had an outer diameter of 18.6 mm, an inner diameter of 10.4 mm, and a thickness of 4.75 mm.

Coils were prepared by winding two turns tin-plated mild copper foil of 1.3 mm wide and 0.25 mm thick around the rod-shaped cores. Using an impedance analyzer, the coils were measured for Q at 280 MHz. Separately, coils were prepared by winding thirty turns a copper wire having a diameter of 0.35 mm around the toroidal cores. The coils were placed in a temperature-controlled chamber and measured for a temperature coefficient of inductance at 100 kHz using an impedance analyzer. The results are shown in Table 2.

TABLE 2

| Sample No. | PbO (wt %) | $SiO_2$ (wt %) | CoO (wt %) | ZnO (wt %) | $\mu i$ | O | $\alpha\mu r$ (ppm/° C.) |
|---|---|---|---|---|---|---|---|
| 1 | 3.0 | 1.7 | 1.0 | 0.3 | 3 | 360 | 220 |
| 2 | 3.0 | 1.7 | 1.0 | 0.7 | 3 | 330 | 200 |

As compared with the known oxide of JP-A 339913/1996, the inventive samples have at least equivalent Q values and are improved in temperature coefficient of inductance.

Example 2

A series of samples were prepared in accordance with a conventional procedure by mixing source materials such that a composition shown below might be finally obtained, calcining the mixture, pulverizing the mixture, pressure molding the powder into the desired shape (rod or toroidal shape suitable for cores), and firing the compacts at a temperature of 800 to 1,000° C. for about 2 hours.

The final composition had a basic composition consisting of 23 mol % of $Fe_2O_3$, 9 mol % of CuO, and 68 mol % of NiO, to which 0.5 to 6.0% by weight of PbO, 0.3 to 4.0% by weight of $SiO_2$, 0.5 to 3.0% by weight of CoO, and 0 to 1.0% by weight of ZnO were added as additives. In the mixing step, the oxides were used as the sources in the above amounts while talc was used as the $SiO_2$ source in an amount of 0.6 to 8.0% by weight.

The rod-shaped cores were 21 mm long, 9 mm wide, and 5.5 mm thick. The toroidal cores had an outer diameter of 18.6 mm, an inner diameter of 10.4 mm, and a thickness of 4.75 mm. Their Q at 280 MHz and temperature coefficient of inductance ($\alpha\mu r$) at 100 kHz were measured as in Example 1.

FIG. 1 is a graph showing the Q and temperature coefficient of inductance of oxide magnetic material as a function of a PbO content. The oxide magnetic material contained 2.5% by weight of talc, 1.0% by weight of CoO and 0% of ZnO and a varying amount of PbO. Curve 11 indicates a change of Q and curve 12 indicates a change of temperature coefficient of inductance.

In general, oxide magnetic materials having Q of 250 or higher are practically acceptable for operation in high-frequency bands. From this aspect, the oxide magnetic materials of the above composition have a Q of at least 250 and a temperature coefficient of inductance of 250 ppm/° C. or lower when PbO is from 1.5% to 4.5% by weight. That is, oxide magnetic materials having high Q and a low temperature coefficient of inductance are obtained.

Figure 2:
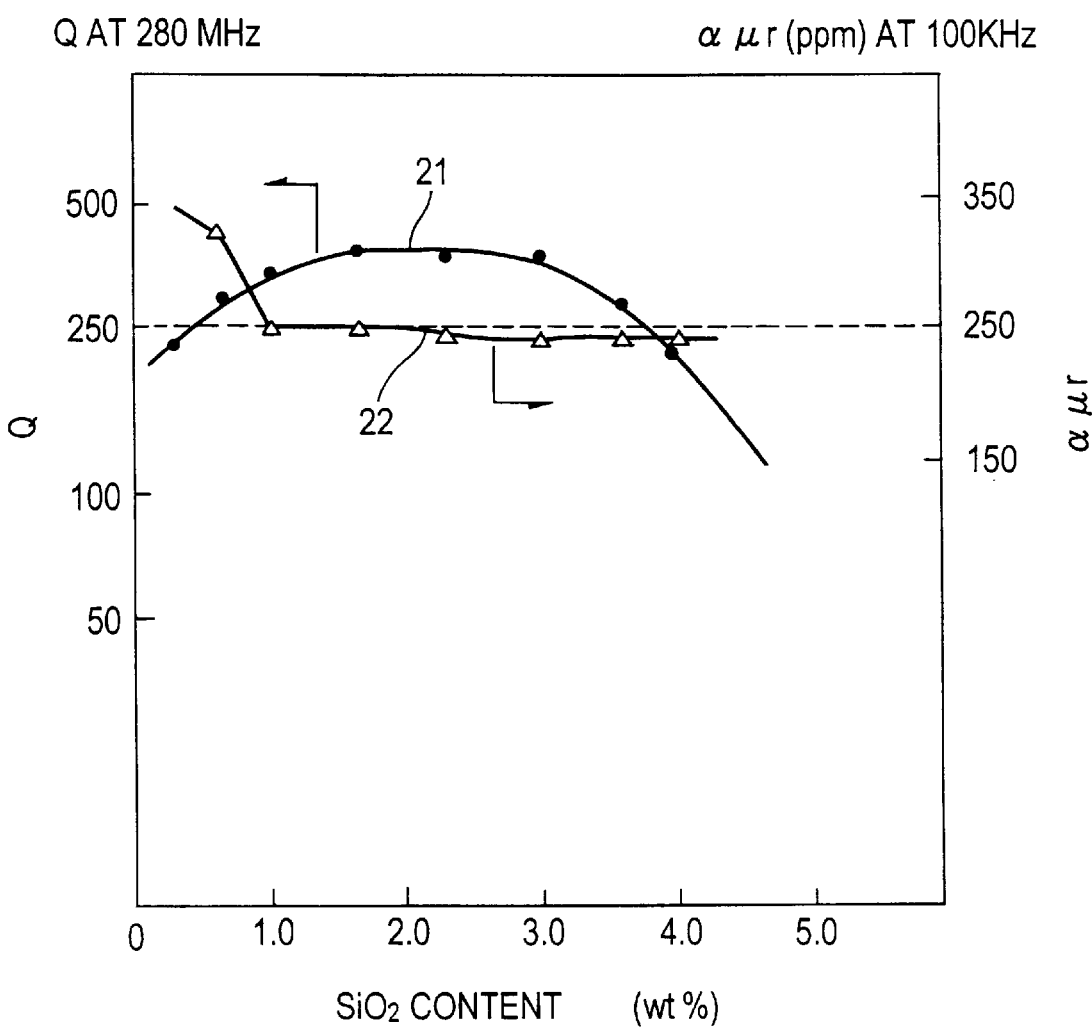
FIG. 2 is a graph showing the Q and temperature coefficient of inductance of oxide magnetic materials as a function of a $SiO_2$ content.

FIG. 2 is a graph showing the Q and temperature coefficient of inductance of oxide magnetic material as a function of a $SiO_2$ content. The oxide magnetic material contained 3.0% by weight of PbO, 1.0% by weight of CoO and 0% of ZnO and a varying amount of $SiO_2$. Curve 21 indicates a change of Q and curve 22 indicates a change of temperature coefficient of inductance. The oxide magnetic materials of the above composition have a Q of at least 250 and a temperature coefficient of inductance of 250 ppm/° C. or lower when $SiO_2$ is from 1.0% to 3.7% by weight.

Figure 3:
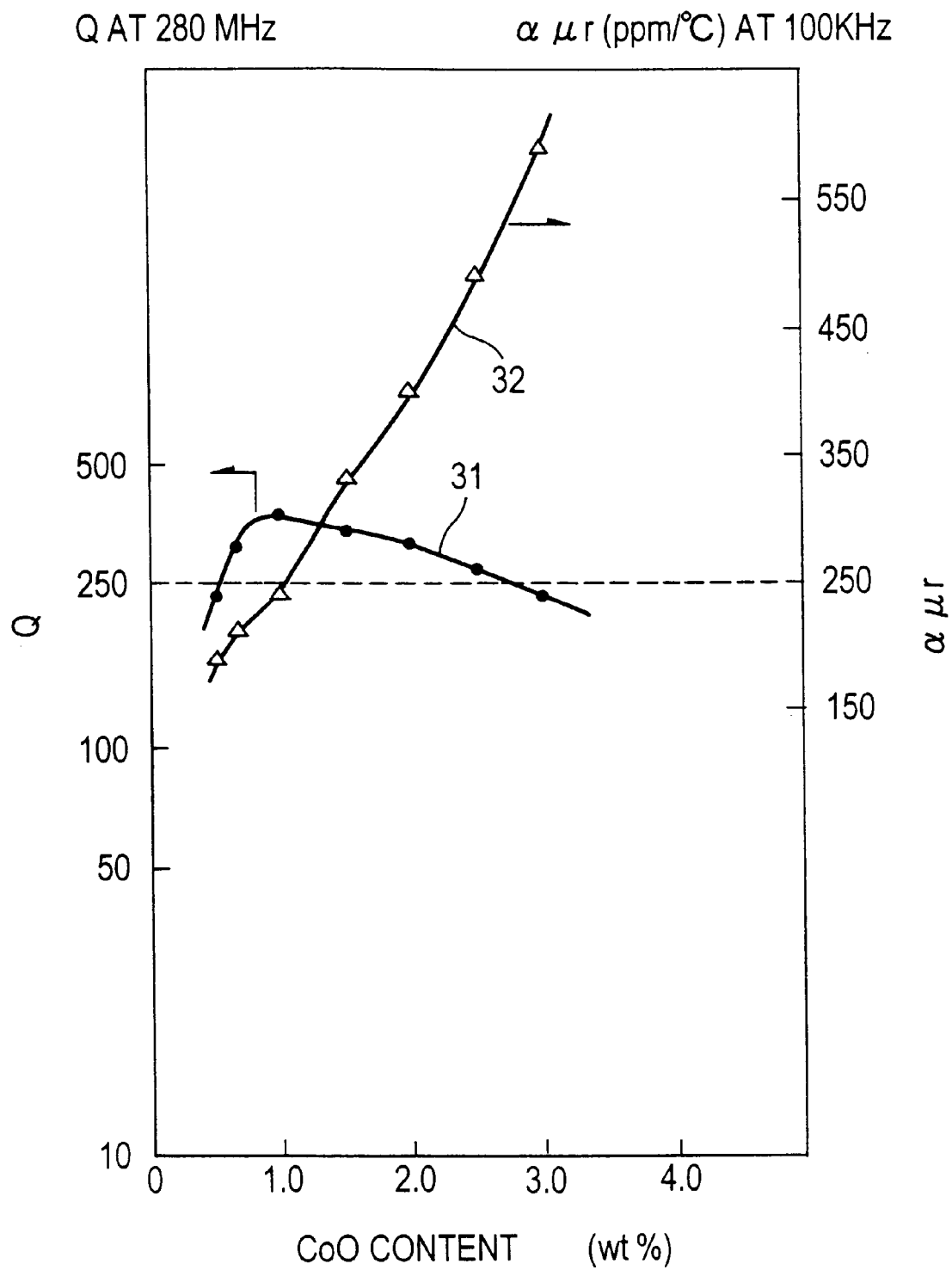
FIG. 3 is a graph showing the Q and temperature coefficient of inductance of oxide magnetic materials as a function of a CoO content.

FIG. 3 is a graph showing the Q and temperature coefficient of inductance of oxide magnetic material as a function of a CoO content. The oxide magnetic material contained 3.0% by weight of PbO, 1.7% by weight of $SiO_2$ and 0% of ZnO and a varying amount of CoO. Curve 31 indicates a change of Q and curve 32 indicates a change of temperature coefficient of inductance. The oxide magnetic materials of the above composition have a Q of at least 250 and a temperature coefficient of inductance of 250 ppm/° C. or lower when CoO is from 0.7% to 1.0% by weight.

Figure 4:
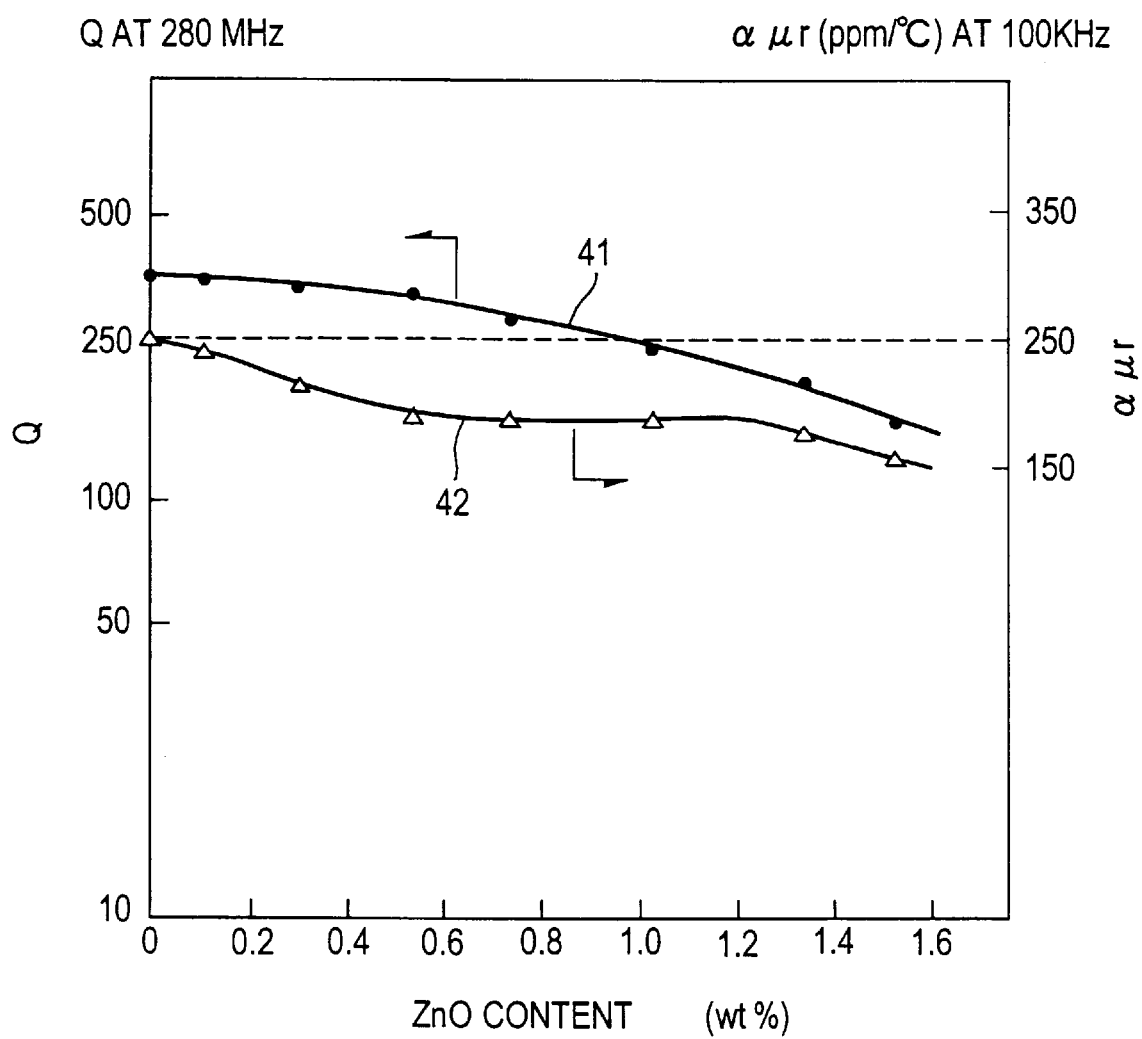
FIG. 4 is a graph showing the Q and temperature coefficient of inductance of oxide magnetic materials as a function of a ZnO content.

FIG. 4 is a graph showing the Q and temperature coefficient of inductance of oxide magnetic material as a function of a ZnO content. The oxide magnetic material contained 3.0% by weight of PbO, 1.7% by weight of $SiO_2$ and 1.0% of CoO and a varying amount of ZnO. Curve 41 indicates a change of Q and curve 42 indicates a change of temperature coefficient of inductance. The oxide magnetic materials of the above composition have a Q of at least 250 and a temperature coefficient of inductance of 250 ppm/° C. or lower when ZnO is from 0.01% to 1.0% by weight.

It is thus evident that when oxide magnetic materials consisting essentially of 15 to 30 mol % of $Fe_2O_3$, 6 to 12 mol % of CuO, and 58 to 79 mol % of NiO as main ingredients as is well known in the art further contain 1.5 to 4.5% by weight of PbO, 1.0 to 3.7% by weight of $SiO_2$, 0.7 to 1.0% by weight of CoO, and 0.01 to 1.0% by weight of ZnO as additives, they have a Q of at least 250 and a temperature coefficient of inductance of up to 250 ppm/° C.

When oxide magnetic materials are prepared using talc instead of $SiO_2$, no significant difference in properties is developed. It is only required to mix 1.5 to 5.5% by weight of talc so that the oxide magnetic materials as fired may finally contain 1.0 to 3.7% by weight of $SiO_2$.

Using cores formed of the oxide magnetic materials of the invention, antenna coils and inductance elements for pagers and other electronic equipment were fabricated. They exhibited the desired high Q and stable temperature property.

There have been described oxide magnetic materials exhibiting the desired high Q and temperature stability in a high-frequency band of higher than about 100 MHz. In the method of preparing such oxide magnetic materials by firing a mixture of oxides, talc can be used as a substitute for $SiO_2$. Although a minor amount of MgO is left in the oxide magnetic materials, it does not substantially alter the properties of the materials. The use of talc which is less expensive than $SiO_2$ is economically advantageous in preparing oxide magnetic materials exhibiting the desired high Q and temperature stability. Antenna coils and inductance elements for pagers and other electronic equipment fabricated using cores of the oxide magnetic materials of the invention exhibit a reduced change of inductance with temperature while maintaining the desired high Q.

Japanese Patent Application No. 81765/1997 is incorporated by reference.

Reasonable modifications and variations are possible from the foregoing disclosure without departing from either the spirit or scope of the present invention as defined by the claims.

We claim:

1. An oxide magnetic material adapted for operation in high-frequency bands, consisting essentially of 15 to 30 mol % of $Fe_2O_3$, 6 to 12 mol % of CuO, and 58 to 79 mol % of NiO as main ingredients, and further containing 1.5 to 4.5% by weight of PbO, 1.0 to 3.7% by weight of $SiO_2$, 0.7 to 1.0% by weight of CoO, and 0.01 to 1.0% by weight of ZnO as additives, provided that all the ingredients are calculated as oxides.

2. The oxide magnetic material of claim 1 adapted for operation in a high-frequency band of 200 to 500 MHz.

3. A method for preparing an oxide magnetic material comprising the steps of:

mixing a $Fe_2O_3$ source, a CuO source, and a NiO source as main ingredients, and a PbO source, talc, a CoO source, and a ZnO source as additives, and firing the resulting mixture, the amounts of the sources being selected such that the resulting oxide magnetic material may consist essentially of 15 to 30 mol % of $Fe_2O_3$, 6 to 12 mol % of CuO, and 58 to 79 mol % of NiO as main ingredients, and contain 1.5 to 4.5% by weight of PbO, 1.0 to 3.7% by weight of $SiO_2$, 0.7 to 1.0% by weight of CoO, and 0.01 to 1.0% by weight of ZnO as additives, provided that all the ingredients are calculated as oxides.

4. An antenna coil comprising a magnetic core of the oxide magnetic material of claim 1.

5. An inductance element comprising a magnetic core of the oxide magnetic material of claim 1.

* * * * *